(12) United States Patent
Kalberer et al.

(10) Patent No.: US 9,709,616 B2
(45) Date of Patent: Jul. 18, 2017

(54) MONITORING DEVICE, SAFETY SYSTEM AND METHOD FOR OPERATING A SAFETY SYSTEM

(71) Applicant: FESTO AG & CO. KG, Esslingen (DE)

(72) Inventors: Roland Kalberer, Kirchheim (DE); Martin Hommel, Leonberg (DE); Colin Leitner, Wendlingen (DE)

(73) Assignee: FESTO AG & CO. KG, Esslingen (DE)

( * ) Notice: Subject to any disclaimer, the term of this patent is extended or adjusted under 35 U.S.C. 154(b) by 54 days.

(21) Appl. No.: 14/561,860

(22) Filed: Dec. 5, 2014

(65) Prior Publication Data

US 2015/0168475 A1 Jun. 18, 2015

(30) Foreign Application Priority Data

Dec. 18, 2013 (EP) ..................................... 13005910

(51) Int. Cl.
| | | |
|---|---|---|
| *G01R 31/00* | (2006.01) | |
| *G01R 31/02* | (2006.01) | |
| *G01R 31/327* | (2006.01) | |
| *G05B 19/042* | (2006.01) | |
| *G01R 31/28* | (2006.01) | |

(52) U.S. Cl.
CPC ....... *G01R 31/025* (2013.01); *G01R 31/2829* (2013.01); *G01R 31/3277* (2013.01); *G05B 19/0428* (2013.01)

(58) Field of Classification Search
CPC .................................................... G01R 31/025

USPC ........................... 324/538–543; 375/224–228
See application file for complete search history.

(56) References Cited

U.S. PATENT DOCUMENTS

| | | | | |
|---|---|---|---|---|
| 5,381,348 A | * | 1/1995 | Ernst .................... | G01R 31/021 324/533 |
| 6,198,612 B1 | | 3/2001 | Manner | |
| 8,884,630 B2 | * | 11/2014 | Siddiquie ............. | G01R 31/046 257/48 |
| 2005/0111537 A1 | * | 5/2005 | Sunter .............. | G01R 31/31709 375/226 |
| 2011/0234287 A1 | * | 9/2011 | Murray .................. | G01R 23/15 327/299 |

(Continued)

FOREIGN PATENT DOCUMENTS

| | | |
|---|---|---|
| DE | 102007056519 | 6/2008 |
| DE | 102009060662 | 7/2011 |

(Continued)

*Primary Examiner* — Jeff Natalini
(74) *Attorney, Agent, or Firm* — Hoffmann & Baron, LLP (57) ABSTRACT

A monitoring device for monitoring safety components including monitoring electronics which include a plurality of clock generators and evaluation means and on which at least two interfaces to be monitored for electric coupling to safety components are formed, wherein each of the interfaces includes at least two output ports and at least two input ports, wherein each of a first output port and a second output port is connected to a clock generator designed for providing clocked electric monitoring signals, wherein a first input port and a second input port are connected to the evaluation means, and wherein a number of clock generators greater than two and less than a number of all output ports of the interfaces to be monitored is chosen.

13 Claims, 11 Drawing Sheets

(56) References Cited

U.S. PATENT DOCUMENTS

2013/0234723 A1* 9/2013 Behrens ............ G01R 31/3191
   324/537

FOREIGN PATENT DOCUMENTS

EP 0864875 9/1998
EP 1533622 5/2005

* cited by examiner

MONITORING DEVICE, SAFETY SYSTEM AND METHOD FOR OPERATING A SAFETY SYSTEM

BACKGROUND OF THE INVENTION

The invention relates to a monitoring device for monitoring safety components, comprising monitoring electronics which include a plurality of clock generators and evaluation means and on which at least two interfaces to be monitored for electric coupling to safety components are formed, wherein each of the interfaces comprises at least two output ports and at least two input ports, wherein each of a first output port and a second output port is connected to a clock generator designed for providing clocked electric monitoring signals, wherein a first input port and a second input port are connected to the evaluation means designed for an evaluation of incoming monitoring signals and for an output of a fault message when provided monitoring signals fail to appear. The invention further relates to a safety system and a method for operating a safety system.

From EP 0864875 A2, a method for checking a safety circuit for electric loads such as electric machines, in particular presses or the like, for short-circuits and/or faults is known. In this method, the safety circuit comprises at least one control output and at least one input, the number of inputs preferably differing from the number of control outputs. In the execution of the method, it is provided that each control output emits an output signal, that the output signals are fed as input signals to the input ports and that each output signal is used for checking for a potential short-circuit. It is further provided that several, at least two, output signals are used in parallel, i.e. substantially simultaneously during a phase, for checking for a potential short-circuit between two inputs, and that the total number of output signals in several consecutive phases is checked, each phase being used for checking several, at least two, output signals and/or input signals.

In prior art, it is provided that an individual clock generator is assigned to each of the outputs connected to a clock generator. In a further example of prior art known to the applicant but not available as a document, it is provided that first outputs of all interfaces are connected to a first clock generator and second outputs of all interfaces are connected to a second clock generator.

SUMMARY OF THE INVENTION

The invention is based on the problem of specifying a monitoring device, a safety system and a method for operating a safety system, by means of which different fault types can be detected.

According to a first aspect of the invention, this problem is solved by a monitoring device of the type referred to above, wherein it is provided that a number of clock generators greater than two and less than a number of all output ports of the interfaces to be monitored is chosen.

In this context, it can be provided that a common clock signal is made available at each first output port of several interfaces to be monitored. To improve the meaningfulness of fault messages of the monitoring device compared to prior art, which provides in total only two clock generators for all output ports of the interfaces to be monitored, the invention provides that individual clock signals made available by separate clock generators are applied to second output ports of at least two interfaces.

Alternatively, it can be provided that a first common clock signal is applied to the first output ports of each of a group of interfaces to be monitored and that, at second output ports of sub-groups of this group of interfaces, clock signals which are identical within the sub-groups but different from those of the other sub-groups are made available.

In the present embodiment, a number of four clock generators is, if four interfaces are to be monitored, sufficient for monitoring the total number of eight output ports.

Advantageous further developments of the invention are the subject matter of the dependent claims.

In a further development of the invention, it is provided that the first output port of each interface to be monitored is connected to an individually assigned clock generator, and that second output ports of at least two interfaces are connected to a common clock generator. In this way, an individual monitoring signal can be provided at each of the interfaces at the respective first output port, while a monitoring signal which may be provided at at least one further interface or at several further interfaces as well is provided at the second output port of the respective interface. By such a provision of monitoring signals to the respective output ports, a simplified structure for the monitoring electronics can, as described at a later point in the explanation of the method, be obtained without any substantial loss of checking facilities irrespective of a reduction of the number of clock generators compared to prior art, in which a clock generator is assigned to each output port, while checking facilities can be improved substantially compared to prior art, which provides only two clock generators for all interfaces.

It is expedient if the further clock generator is connected to all second output ports of the interfaces to be monitored. In this embodiment, an individual clock generator is therefore provided for each of the interfaces to be monitored and a common clock generator is provided for all interfaces to be monitored, so that the number of clock generators is greater by the value of one than the number of interfaces to be monitored but smaller than the number of first and second output ports of these interfaces. This allows for the desired simpler structure of the monitoring electronics.

In a further development of the invention, it is provided that each interface has two output ports and two input ports, and that a first output port is connected to the individually assigned clock generator and a second output port is connected to the further clock generator, and that a first input port is connected to the evaluation means and a second input port is connected to the evaluation means. The safety components to be monitored frequently are two-channel switches or sensors in which electric signals or supply voltages are routed via two parallel lines from the first and second output ports of the interface to the safety component. If the switches are closed or if environmental influences to be measured are applied to the sensors, these electric signals are made available to the first and second input ports of the interface via two further, likewise parallel, lines. If the switches are open or if suitable environmental influences are present, at least one of the two parallel lines does not make the electric signal available to the first and second input ports of the interface. The purpose of the monitoring electronics is to make possible a detection of malfunctions of the switches or sensors and/or of line faults such as short-circuits by a controlled application of monitoring signals to the respective lines.

According to a second aspect of the invention, the problem of the invention is solved by a safety system that includes a monitoring device as described above and at least one safety component which comprises connecting means for connection to an interface of the monitoring device, the connecting means comprising at least four electric lines designed in pairs for the electric coupling of a functional element to be monitored, in particular a switch or a sensor. The safety component may, for example, be a two-channel safety switch, such as an emergency stop switch. In such a safety switch, two independent switching contacts are provided, each of which is connected to associated electric lines, the electric lines being connected to the interface of the monitoring device. With the monitoring device according to the invention, such a safety component can be checked both for the function of the switching contacts and for the function of the electric lines. In the illustrated embodiment, the safety system comprises at least three safety components, and the monitoring device is designed for the connection of these at least three safety components.

According to a third aspect of the invention, the problem of the invention is solved by a method for operating a safety system. In this, it is provided that safety components are connected to each interface of a monitoring device, and that the monitoring device comprises at least two clock generators which are designed for making available monitoring signals to output ports of the interfaces, and evaluation means for monitoring input connections of the interfaces for an arrival of transmitted monitoring signals, wherein the clock generators are operated in such a way that, in recurring periods of time, the monitoring signals made available to the output ports by the at least two clock generators have a signal level below a presettable response threshold of the evaluation means. In the recurring periods of time in which the monitoring signals made available to the output ports have a signal level below a presettable response threshold of the evaluation means, it is therefore possible to check whether unwanted connections of the monitored safety components could be short-circuited with electric supply lines. This method can be used to advantage both for the safety system according to the invention and for safety systems fitted with monitoring devices of prior art. The inventive difference from known methods lies in the fact that, when checking the connected safety components in the periods of time in which the monitoring signals made available to the output ports have a signal level below a presettable response threshold of the evaluation means, switching operations of the connected safety components cannot be detected. However, since the periods of time in which the monitoring signals made available to the output ports have a signal level below a presettable response threshold of the evaluation means can be very short, the safety function to be ensured by the safety components is not affected in practical terms. By way of example, the duration of the periods of time in which the monitoring signals made available to the output ports have a signal level below a presettable response threshold of the evaluation means can be in the range of a few milliseconds.

In a further development of the method, it is provided that each first output port of the interfaces to be monitored is assigned a clock generator for the provision of an individual monitoring signal, and that at least one clock generator is connected to second output ports of at least two interfaces for making available a common monitoring signal to these second output ports, wherein at a presettable first point in time all individual monitoring signals and at least one common monitoring signal are made available to the first and second output ports.

As a result, a synchronous check of all connected safety components can be performed at the first point in time in order to determine whether the available monitoring signals arrive at the associated input ports of the interfaces as specified by the invention, or whether this is not the case. If the safety components are, for example, emergency stop switches or door contact switches, which are closed in a normal operation of a machine equipped with the safety system, a checking cycle can establish whether the safety components are in the expected closed state or whether faults have occurred, for example if there is a deviation from normal operation, such as caused by the actuation of an emergency stop switch or the opening of a door fitted with a door contact switch. If the occurrence of a fault or a deviation from normal operation is detected, a fault message can be output, leading in particular to an emergency stop of the monitored machine.

In a further development of the method, it is provided that the individual monitoring signals and/or the at least one common monitoring signal is/are made available to the respective output ports in cyclic recurrence. By means of a cyclically recurrent provision and an interim shutdown of the respective individual monitoring signals, it can be established whether other individual monitoring signals are present at input ports of interfaces to which these individual monitoring signals are not assigned. This leads to the conclusion that the safety component to which the respective individual and/or common monitoring signals should be applied is faulty, and that the individual monitoring signal of this safety component is erroneously present at at least one other input port.

In a further development of the method, it is provided that the clock generators for the provision of the monitoring signals are activated and deactivated in a time-offset manner. In this way, different combinations of individual and common monitoring signals can be provided to the connected safety components at different points in time and checked for faults or deviation from normal operation by the associated evaluation means, wherein different conclusions can be drawn regarding the presence of faults from the respectively active clock generators and the resulting monitoring signals.

In a further development of the method, it is provided that no individual monitoring signal is applied to the interfaces at a presettable second point in time. In this way, faults in electric lines of the respective safety components, to which a common monitoring signal is applied, can be detected.

In a further development of the method, it is provided that no common monitoring signal is applied to the respective interfaces at a presettable third point in time. In this way, a conclusion can be drawn whether the at least one electric line of the respective safety component, to which the individual monitoring signal is applied, is faulty, depending on which of the individual monitoring signals is active at the relevant point in time.

In a further development of the method, it is provided that the clock generators are operated in such a way that at least one interface receives no individual monitoring signal and no common monitoring signal at a presettable fourth point in time. In this way, it is, for example, possible to detect a short-circuit against a supply voltage, if no common monitoring signal is made available to the interfaces at the presettable second point in time, but an electric signal is present at at least one of the ports.

In a further development of the invention, it is provided that an individual monitoring signal is applied to only one interface at a presettable point in time. In this way, it can be established whether there is a fault in the line of the associated safety component, to which this individual monitoring signal is applied.

In a further development of the invention, it is provided that cycle times for the provision of the monitoring signals are chosen to differ from one another. In this way, different chronological overlaps between individual and/or common monitoring signals can be obtained, for example in order to interrupt an electric supply of a sensor designed as a safety component for a short time only for monitoring purposes, with the aim of influencing its measuring results only slightly if at all, while, for example, a safety component designed as an emergency stop switch can be monitored without putting the function of that safety component at risk even if the monitoring signals are deactivated for a longer time.

In a further development of the invention, it is provided that at least one clock generator is permanently activated and the monitoring signal made available thereby is used for the electric supply of the safety component.

BRIEF DESCRIPTION OF THE DRAWINGS

Advantageous embodiments of the invention are illustrated in the drawing, of which.

DETAILED DESCRIPTION

Figure 1:
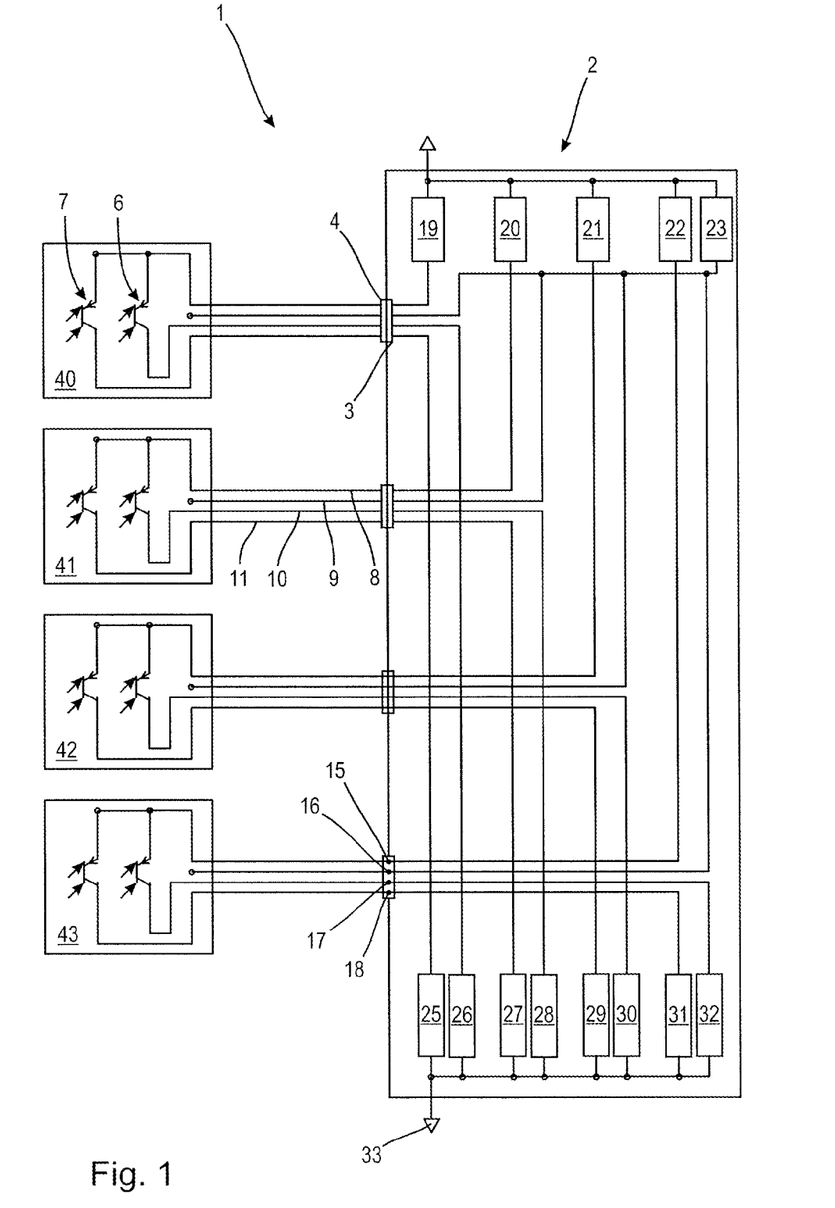
FIG. 1 shows a first embodiment of a safety system with a monitoring device and with safety components designed as sensors connected thereto.

FIG. 1 shows a safety system 1 with a monitoring device 2 of the type which can, for example, be used at a machine not shown in detail, which is potentially hazardous to humans and/or objects. Such machines may, for example, be robots, saws, milling machines, lathes or other equipment in which powered components are moved and/or fast-moving tools are operated. For such machines, a multitude of safety-related devices is prescribed in order to reduce any risks to humans and/or objects to a minimum. These safety-related devices typically include safety systems 1 which are designed to secure predetermined regions on or about the machine, for example by providing covers, doors, floor sections and/or spaces with door opening switches, pressure switching mats or light grids. Such devices are in particular intended to prevent any unwanted intrusion into such regions to be secured. In the case of such an intrusion, an emergency stop of the machine has to be initiated in order to minimise any risk to an operator or to the machine.

For this purpose, the safety system 1 shown in FIG. 1 comprises a plurality of safety components 40, 41, 42, 43, which are designed identically in the illustrated embodiment and which are connected to interfaces 3 of the monitoring device 2 by connecting means 4. In the illustrated example, each of the safety components 40, 41, 42, 43 comprises two light-sensitive electronic switches 7, 8, which are designed as photo transistors and form a part of a light grid for receiving light rays, which is not shown in detail. The light rays in turn pass in a grid arrangement through an intervention surface and are at least partially interrupted if there is an intervention through the intervention surface. Such an interruption can be detected by means of the switches 7, 8, in order to trigger an emergency stop or shutdown for the machine. In this context, it is in particular provided that it is checked at presettable time intervals whether the electric connections between the monitoring device 2 and the safety components 40, 41, 42, 43 are free of faults. Otherwise, a transmission of signals from the safety components 40, 41, 42, 43 to the monitoring device 2 and to any machine controller coupled to the monitoring device 2, in particular a programmable logic controller (PLC), could be affected, for example by damage to electric lines, in particular an electric short-circuit.

In the illustrated embodiment, it is provided that each of the connecting means 4 of the safety components 40, 41, 42, 43 to be monitored comprises four electric lines 8, 9, 10 and 11. The first electric line 8 is connected to a first port 15 of the interface 4, which is also described as first output port, because a first monitoring signal is made available there by the monitoring device 2. The second electric line 9 is connected to a second port 16 of the interface 4, which is also described as second output port, because a second monitoring signal is made available there by the monitoring device 2. The third electric line 10 is connected to a third port 17 of the interface 4, which is also described as first input port, because a first monitoring signal transmitted by the connected safety component 40, 41, 42, 43 is made available there, and the fourth electric line 11 is connected to a fourth port 18 of the interface 4, which is also described as second input port, because a second monitoring signal transmitted by the connected safety component 40, 41, 42, 43 is made available there.

In the illustrated embodiment, it is further provided that a clock generator 19, 20, 21, 22 individually assigned to each safety component 40, 41, 42, 43 at the first output port 15 is connected to the respective first electric line 8 of the respective safety component 40, 41, 42, 43. In the present example, the first electric line 8 is in turn connected to both electronic switches 6, 7 and is from there routed as line 10 or 11 respectively to the first or second input port 17, 18.

In the illustrated embodiment, it is further provided that each second electric line 9 of each of the safety components 40, 41, 42, 43 is connected to a common clock generator 23 via the respective second output port 16 of the associated interface 3. The electric energy made available by the common clock generator 23, in particular in the form of a sustained signal, can be used for supplying the two electronic switches 6, 7 in the respective safety components 40, 41, 42, 43.

In each of the safety components 40, 41, 42, 43, the electronic switch 6 is connected to the electric line 11. In each of the safety components 40, 41, 42, 43, the electronic switch 7 is connected to the electric line 10. Each of the electric lines 10, 11 of the respective electronic switches 6, 7 is electrically connected to an evaluation circuit 25 to 32 designed for detecting a flow of current through the respective line 10, 11 via the associated input port 17, 18. Each of the evaluation circuits 25 to 32 is designed for outputting an output signal which is output only if a flow of current through the respective line 10, 11 exceeds a presettable threshold value. The output signals of the evaluation circuits 25 to 32 are made available to a common signal port 33, which is connected to a machine controller which is not shown in the drawing and which is capable of evaluating the output signal for the presence of unexpected signal courses and capable of initiating a machine shutdown if required.

In the illustrated embodiment, it may be provided that the clock generators 19 to 22 are operated by internal communication means not shown in the drawing or by suitable external selection by the machine controller in such a way that a preset signal pattern is present at the signal port 33 if the monitored safety components 40, 41, 42 and 43 operate correctly. In contrast, there are deviations from the preset signal pattern at the signal port 33 if there are any malfunctions in the electric lines 8 to 10 and/or in the monitored safety components 40, 41, 42 and 43. The evaluation of these signal patterns will be explained in greater detail below with reference to FIGS. 4 to 11.

Figure 2:
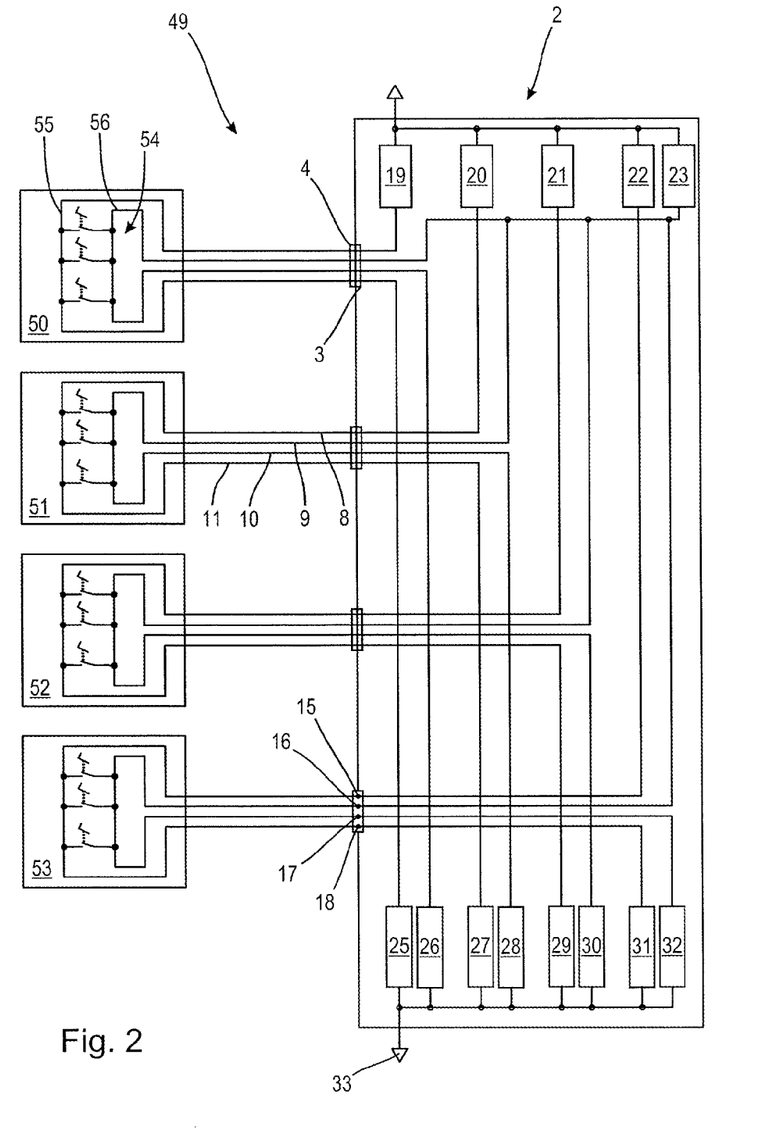
FIG. 2 shows a second embodiment of a safety system, in which the safety components are designed as pressure switching mats.

In the embodiment of a safety system 49 shown in FIG. 2, each of the safety components 50, 51, 52 and 53 comprises multipole switches 54 of the type which may, for example, be provided in pressure switching mats. Pressure switching mats are used to monitor floor regions and are constructed such that, if someone treads on the pressure switching mat, an electric short-circuit is established between two lines, allowing a current which can be interpreted as a switching signal to flow. In the normal state, i.e. without a user standing on the pressure switching mat, there is no short-circuit and therefore no flow of current between the lines. In order to establish nevertheless whether the lines are intact and a switching signal triggered by stepping on the pressure switching mat can be transmitted, the respective lines are looped through the pressure switching mat and can therefore be checked for conductivity. In the illustrated embodiment, it is provided that the safety components 50, 51, 52 and 53 are connected to a monitoring device 2 as described with reference to FIG. 1. In the second embodiment of a safety system 49 as shown in FIG. 2, each first line 8 is designed as the start of a first conductor loop 55, while the second line 9 is designed as the start of a second conductor loop 56. Furthermore, the third line 10 is designed as the end of the first conductor loop 55 and the fourth line 11 is designed as the end of the second conductor loop 56.

For using the monitoring device 2, the embodiment of the safety system 49 provides that the clock generators 19 to 23 supply the respective lines 8 to 11 with electric energy in preset, in particular cyclically recurring, time intervals, and that the evaluation circuits 25 to 32 detect a flow of current in the respective lines 8 to 11. It is further provided the clock generators 19 to 23 at least temporarily do not output a monitoring signal with a signal level above a response threshold of the evaluation circuits 25 to 32 which can be detected by the associated evaluation devices, so that there should be no signal present at the signal port 33 during this time, if all components of the safety system 49 function correctly. However, if a signal is present, a malfunction in the safety system 49 has to be suspected.

This procedure can even be used in a safety system with monitoring devices of prior art, in particular in a safety system with monitoring devices which have precisely two clock generators for all interfaces to be monitored. Here, too, the presence of short-circuits of individual lines against a supply voltage can be suspected in the period of time in which neither of the clock generators outputs a monitoring signal which can be detected by the evaluation means.

Figure 3:
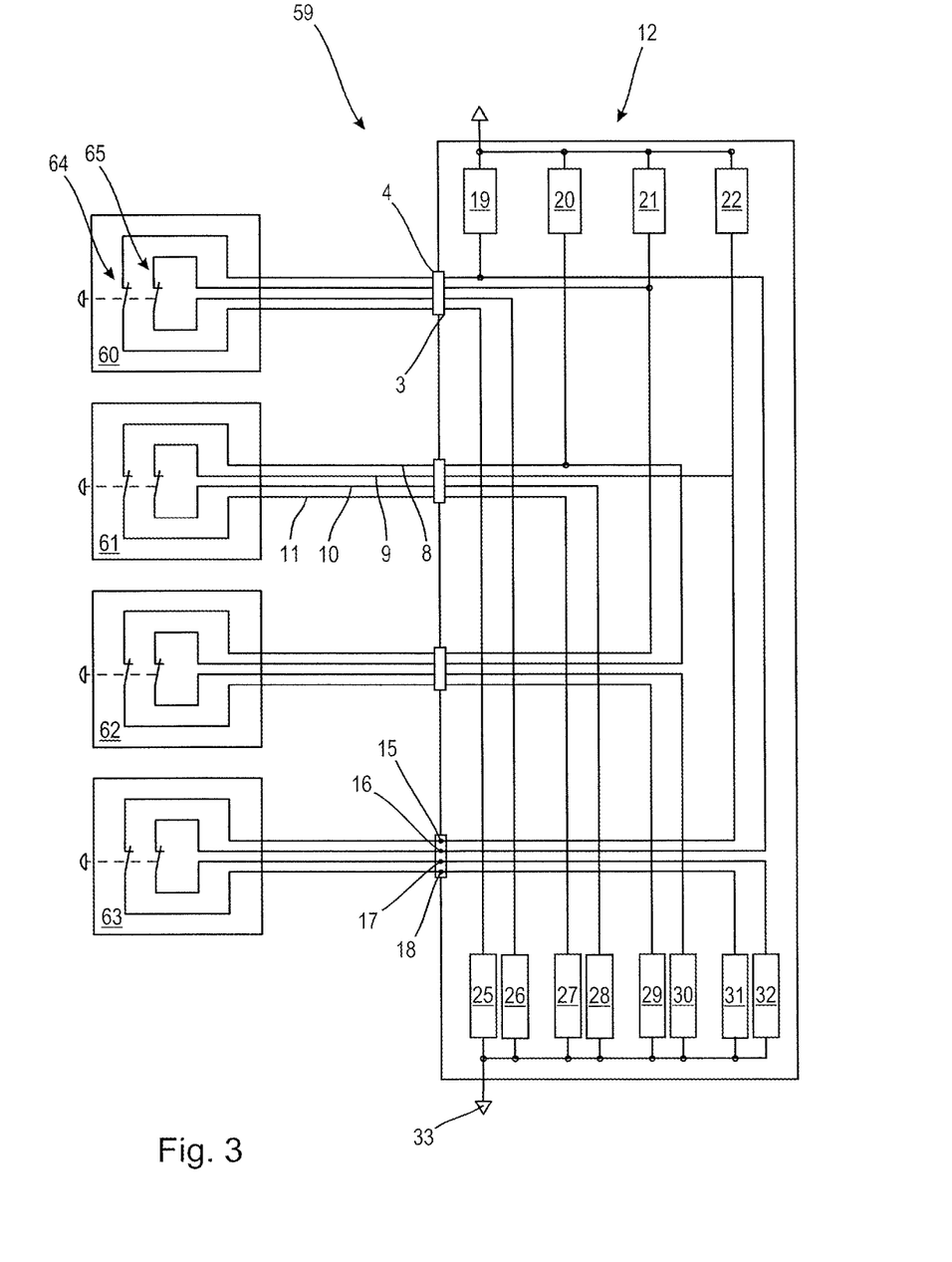
FIG. 3 shows a third embodiment of a safety system, in which the safety components are designed as two-channel switches.

In the embodiment of a safety system 59 shown in FIG. 3, the safety components 60, 61, 62 and 63 are not pressure switching mats as shown in FIG. 2, but two-pole, mechanically coupled switches, as is for example the case in emergency stop switches. There is further provided a second embodiment of a monitoring device 12, which differs from the first embodiment of a monitoring device 2 in that two output ports 16, 16 are assigned to each clock generator 19, 20, 21, 22. In the illustrated embodiment, each of the switches 64, 65 of the respective safety component 60, 61, 62 and 63 is placed in an individual conductor loop 67, 68, which can accordingly be interrupted by the respective switch 64, 65. At the start of the respective conductor loop 67 or 68, the lines 8 and 9 are connected to one of the output ports 15, 16 of the monitoring device 2. At the end of the respective conductor loop 67 or 68, the lines 10 and 11 are connected to one of the input ports 17, 18 of the monitoring device 2. The safety components 60, 61, 62 and 63 are preferably configured as normally closed switches, so that there is a flow of current through each of the connected lines 8 to 11 in the operating or normal state. At the signal port 33, the monitoring device 2 makes available an output signal which depends on the switching position of the switches 64, 65 and on the monitoring signals of the clock generators 19 to 23.

In the illustrated embodiment, it is provided that the lines 9 and 10 of the first safety component 60 are connected to the clock generators 19 and 21. It is further provided that the lines 9 and 10 of the second safety component 61 are connected to the clock generators 20 and 22. It is further provided that the lines 9 and 10 of the third safety component 62 are connected to the clock generators 20 and 21. It is further provided that the lines 9 and 10 of the fourth safety component 63 are connected to the clock generators 19 and 22.

The signal courses of monitoring signals as described below and illustrated in FIGS. 4 to 11 can be found in a similar form in each of the embodiments shown in FIGS. 1 to 3 and are, by way of example, explained in greater detail with reference to the safety system 49 according to FIG. 2.

Figure 4:
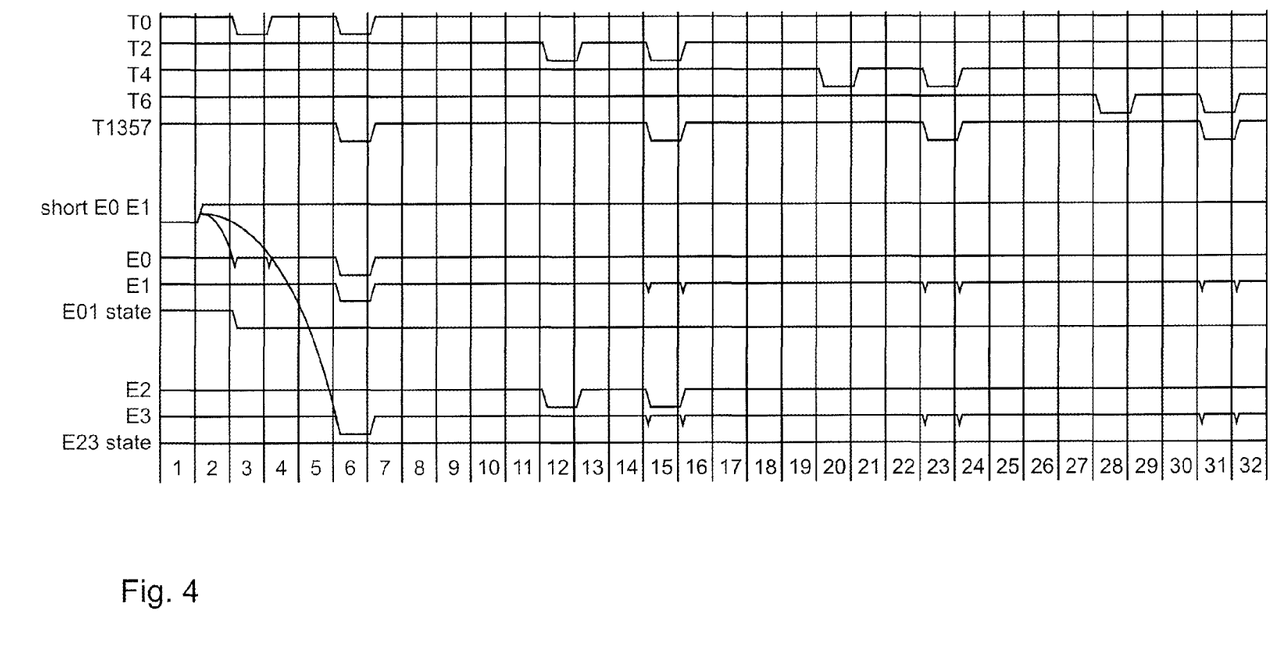
FIG. 4 shows a first signal course diagram for the safety system according to FIG. 3.

In the signal course according to FIG. 4, it is provided that all signal levels or cycles T0, T2, T4 and T6 of the individually assigned clock generators 19 to 22 deliver time-offset logic "low" signals, as applies to cycle T0 in the work cycles 3 and 6, for example. This ensures that two of these clock generators 19 to 22 do not deliver a logic "low" signal simultaneously at any point in time. On the contrary, all individually assigned clock generators 19 to 22 apart from a single clock generator 19 to 22 deliver a logic "high" signal. Furthermore, in all of these clock generators 19 to 22, the illustrated embodiment provides a sequence of two logic "low" signals, each of which has a duration of one work cycle and a time interval of two work cycles. The signal level T1357 of the common clock generator 23 also has a logic "low" signal, which is synchronous with the second logic "low" signal of one of the individual clock generators 19 to 22 and which likewise has a duration of one work cycle.

For simplicity, FIG. 4 only shows the cycles or signal levels arriving at the associated evaluation circuits 25 to 28, and these are given the designations E0, E1, E2 and E3. The signal levels arriving at the remaining evaluation circuits 29 to 33 are ignored in the following considerations. With the designation "short E0 E1", FIG. 4 further indicates the presence of a short-circuit between the lines 10 and 11 of the safety component 50.

By means of the sequence of logic "high" and "low" signal levels, it is possible to check, in the first work cycle of each clock generator 19 to 22 in which a logic "low" signal occurs, whether signals of other clock generators are coupled into the respective line. If a logic "high" signal arrives at the respective associated evaluation circuit 25 to 28 instead of the expected logic "low" signal, this is detected as a fault by the evaluation circuits 25 to 28. In the second work cycle of each individual clock generator 19 to 22, in which a logic "low" signal is once again output, the common clock generator 23 likewise provides a signal level T1357 with a logic "low" signal. At this point in time, it is therefore possible to detect whether a fault detected in the first work cycle by the respective evaluation circuit on the basis of a logic "low" level which has been expected but not arrived is present with a logic "low" level in the second work cycle as well.

In the illustrated embodiment, a short circuit (short E0 E1 at logic "high" level) present from work cycle 2 between the lines 8 and 9 or 10 and 11 of the first safety component 50 is indicated by an unexpected "high" signal in the output signal E0 of the first evaluation circuit 25, because at this point in time there should be no logic "high" signal at the associated evaluation circuit 25. The unexpected presence of a "high" signal has the result that a signal level for an output signal at the signal port 33 is lowered from a logic "high" signal to a logic "low" signal (E01 state). The evaluation of the individual cycle is therefore sufficient of the diagnosis of the short-circuit in this case.

In work cycle 6, the short-circuit check against the line to which a signal level is applied by the common clock generator 23 can nevertheless be performed without being affected by the short-circuit which has already been detected, which simplifies the fault finding process. In the illustrated embodiment, the output signal E3 is reduced to a logic "low" signal level in spite of the already detected short-circuit. This leads to the conclusion that a short-circuit is present between the line connected to the individual clock generator 19 and the line connected to the common clock generator 23.

Figure 5:
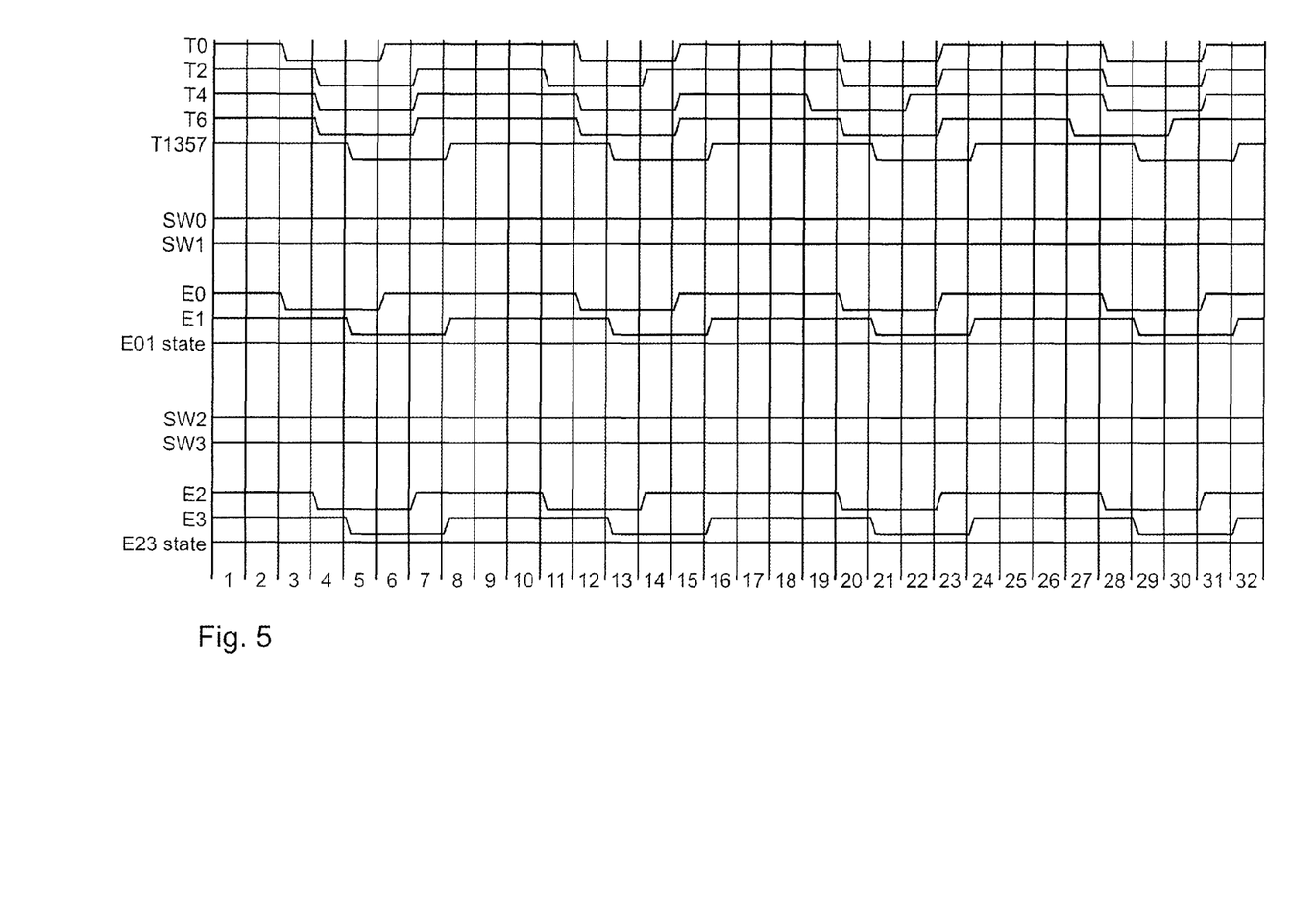
FIG. 5 shows a second signal course diagram for the safety system according to FIG. 3.

In the signal course diagram shown in FIG. 5, it is provided that all monitoring signals adopt a logic "low" level in at least one work cycle. In the illustrated embodiment, this applies to the work cycles 5, 13, 21, 29. However, if one of the evaluation circuits 25 to 32 detects a logic "high" level at this point in time, there is a short-circuit between at least one of the lines 10 or 11 and the supply voltage, i.e. VCC.

It is further provided that each of the clock generators 19 to 23 is activated to deliver a logic "high" level in one work cycle. In FIG. 5, these are work cycles 4, 12, 20, 28 for the common clock generator 23, work cycle 6 for the first individual clock generator 19, work cycle 14 for the second individual clock generator 20, work cycle 22 for the third individual clock generator 21 and work cycle 30 for the fourth individual clock generator 22. Here, it is possible to detect which lines 8, 9 are currently supplied by this cycle, and in particular which are wrongly supplied as a result of a short-circuit between two lines 8, 9, 10, 11.

The illustrated embodiment further provides two groups of periods of time, to each of which the following applies:

In the first group of periods of time, which in the illustrated embodiment are 7, 15, 23, 31, only all individual clock generators 19 to 22 are active.

In the second group of periods of time, which in the illustrated embodiment are 4, 12, 20, 28, only the common clock generator 23 is active.

If the lines 10, 11 are switched between two cycle supplies, it is possible to detect in each work cycle whether the lines 10, 11 are supplied with a logic "high" level by one of the individual clock generators 19 to 22 or by the common clock generator 23. The work cycles are directly sequenced, so that each cycle in a recurrent sequence of identical work cycles is switched off and on only once. In this procedure, it is advantageous if the number of switching operations is kept low, ensuring advantages for the electromagnetic radiation behaviour. It is preferably provided that the work cycle in which all clock generators 19 to 22 are at "low" level is framed by work cycles in which each of the individual clock generators 19 to 22 temporarily adopts a "low" level.

The individual logic levels can be extended individually in order to obtain identical cycle lengths. This can be advantageous for the sensors connected to this system; for example, if these require a minimum pulse duration, no pulse will be longer than the required minimum pulse duration.

Figure 6:
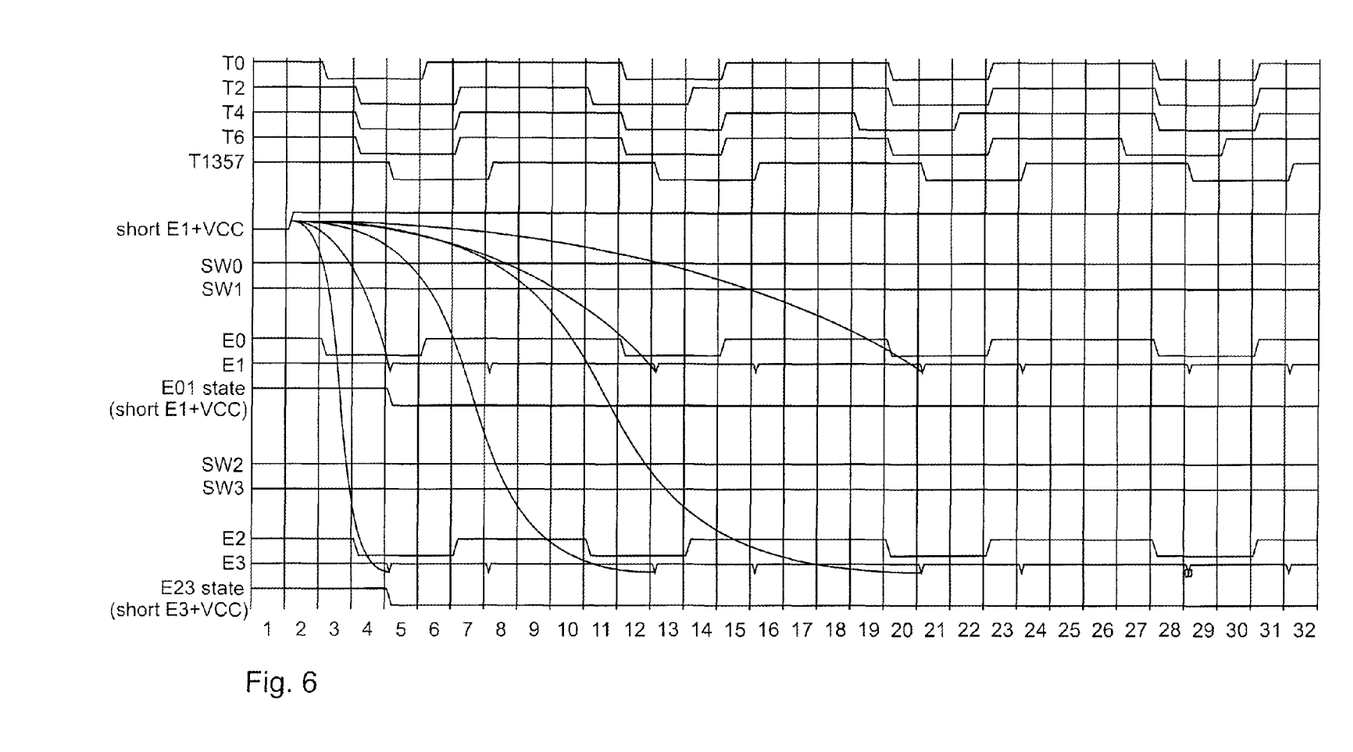
FIG. 6 shows a third signal course diagram for the safety system according to FIG. 3.

The signal course diagram according to FIG. 6 has the same signal cycle as the signal course diagram according to FIG. 5, but we are now considering a fault situation. At the start, there is a short circuit (short E1+VCC) in work cycle 2 between the fourth line 11 of the first safety component 50 of the safety system 49 and the supply voltage (VCC). The short-circuit to VCC is detected in work cycle 5, in which all cycles are at a logic "low" level. If one of the evaluation circuits 25 to 28 of FIG. 6 nevertheless receives a signal at this point in time, the associated line 10, 11 is short-circuited against VCC, and the evaluation circuits 25 to 28 set both a status "E01 state" and a status "E23 state" to a logic "low" level, because in this fault situation, it cannot be distinguished which of the lines 8 to 11 is short-circuited against VCC. This is checked in FIG. 6 in work cycles 5, 13, 21, 29. The detection is therefore carried out in each recurring cycle of work cycles.

If one of the lines 11 is short-circuited against VCC, VCC is constantly applied there. In FIG. 6, there is a short-circuit between the fourth line 11 of the first safety component 50 and VCC. This is measured in work cycles 5, 13, 21, 29 and detected by the fact that the signal at the evaluation circuit 25 remains at a logic "high" level against expectations. The other inputs are not influenced by this.

If one of the third lines 10 is short-circuited against VCC, VCC is constantly applied to all evaluation circuits 26, 28, 30, 32, and the short-circuit cannot be attributed to any of the safety components 50, 51, 52 or 53.

Figure 7:
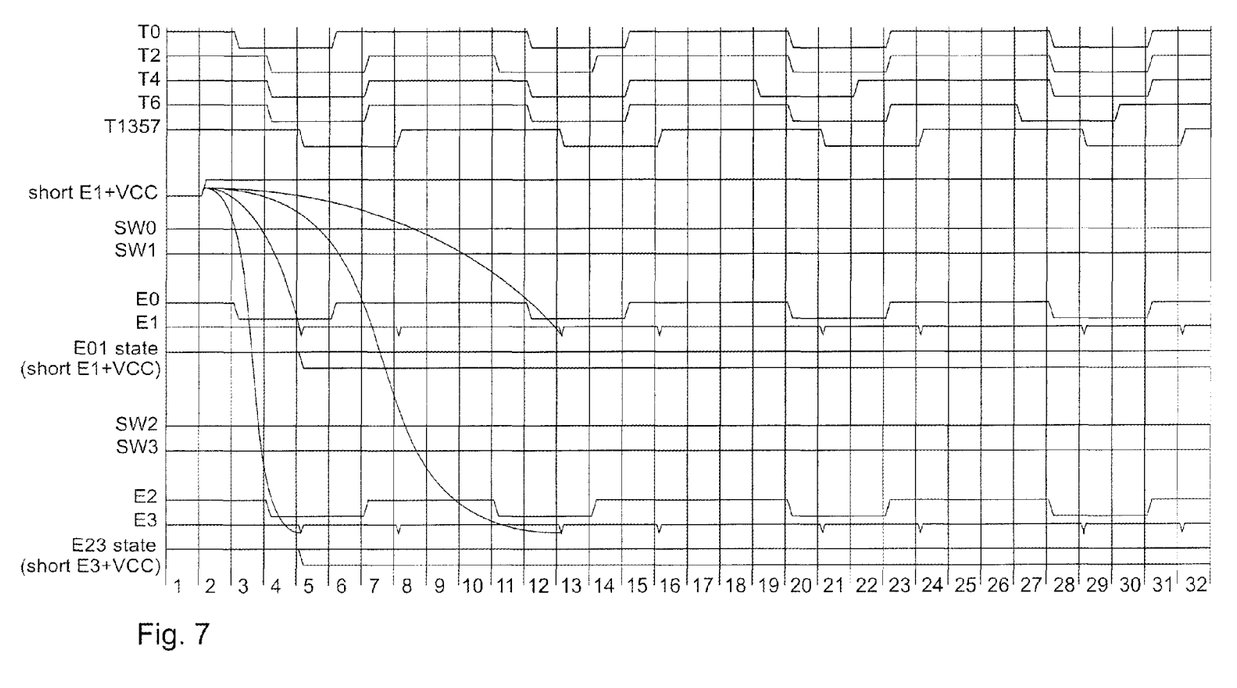
FIG. 7 shows a fourth signal course diagram for the safety system according to FIG. 3.
Figure 8:
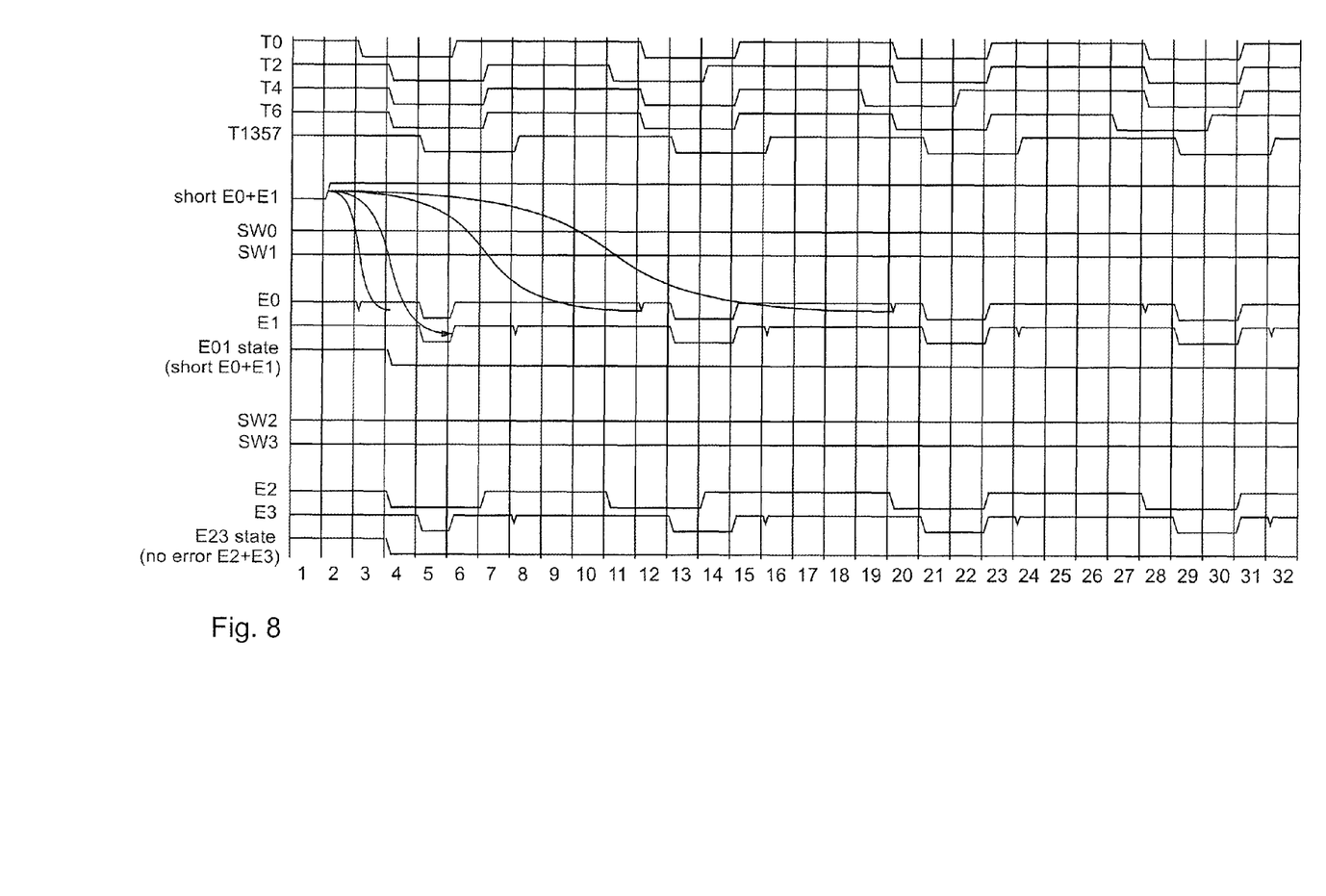
FIG. 8 shows a fifth signal course diagram for the safety system according to FIG. 3.

The signal course diagram according to FIG. 7 starts with the fact of a short-circuit between the lines 8 and 9 or a short-circuit between the lines 10 and 11. In order to detect this short-circuit and to distinguish it from a short-circuit against VCC, there are work cycles in which only one of the clock generators 19 to 23 is switched on, while all the other clock generators 19 to 23 are switched off. In FIG. 7, the common clock generator 23 is active on its own in work cycles 4, 12, 20, 28. If a "high" level is detected in one of the lines 11 in this work cycle and a "low" level is detected in the following work cycle (VCC short-circuit check) on the respective line 11, the respective line 11 is short-circuited against the common clock generator 23. In the embodiment shown in FIG. 7, this applies to the line 11 of the first safety component 50.

Figure 9:
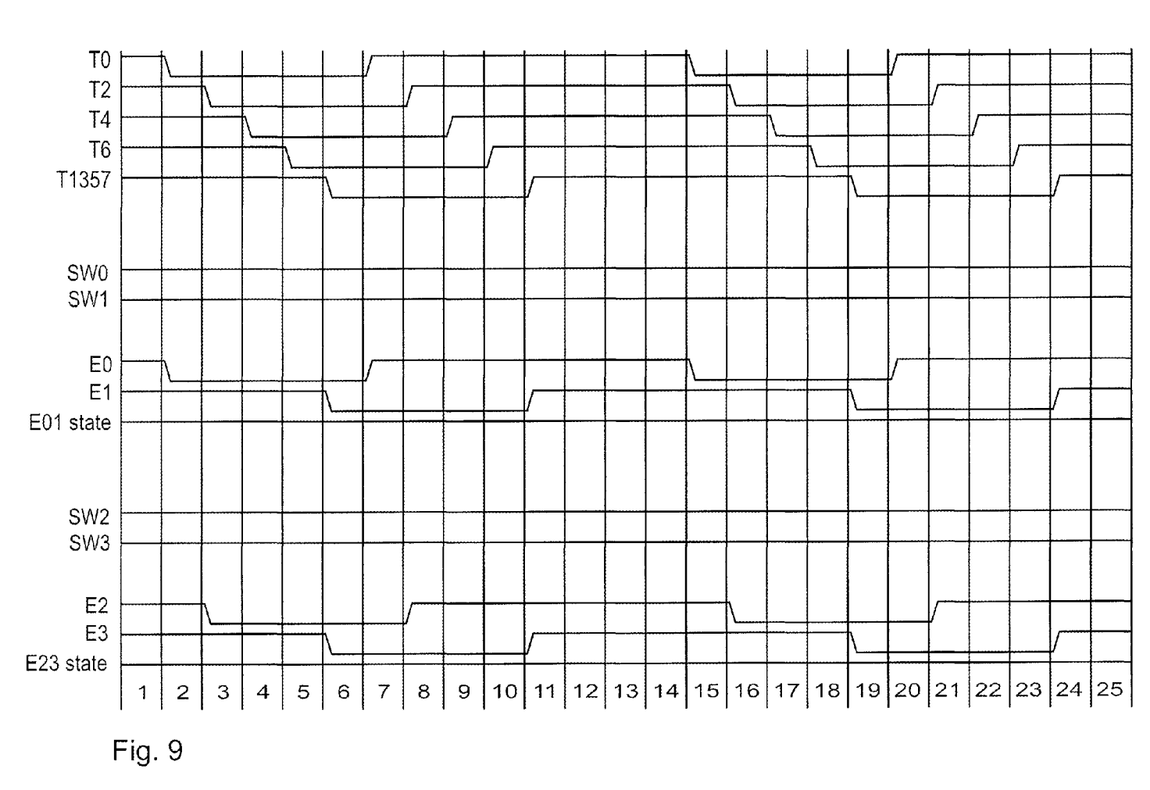
FIG. 9 shows a sixth signal course diagram for the safety system according to FIG. 3.

Alternatively, all cycles can have the same duration but be used in a slightly phase-shifted manner as shown in FIG. 9.

In this way, for two cycles there is always a region in which only one of the two is on, a further region in which both are on and a further region in which both are off.

In FIG. 9, the five clock generators 19 to 23 are switched off from work cycle 2 with an offset of one work cycle each and switched on again from work cycle 7 with an offset of one work cycle each. For example, if there is a short-circuit between the clock generator 20 and the common clock generator 23, the line 11 of the second safety component 51 is wrongly switched off only at work cycle 6, indicating a fault.

In the switch-on process, the situation is reversed; in this case, lines 10 of the safety components 50, 51, 52 and 53 connected to the common clock generator 23 are switched on as well when the clock generator 20 is switched on, likewise indicating a fault.

There are once again work cycles 6 and 19 in which all clock generators 19 to 23 are off and in which the short-circuit against VCC can be distinguished from short-circuits against other clock signals.

Figure 10:
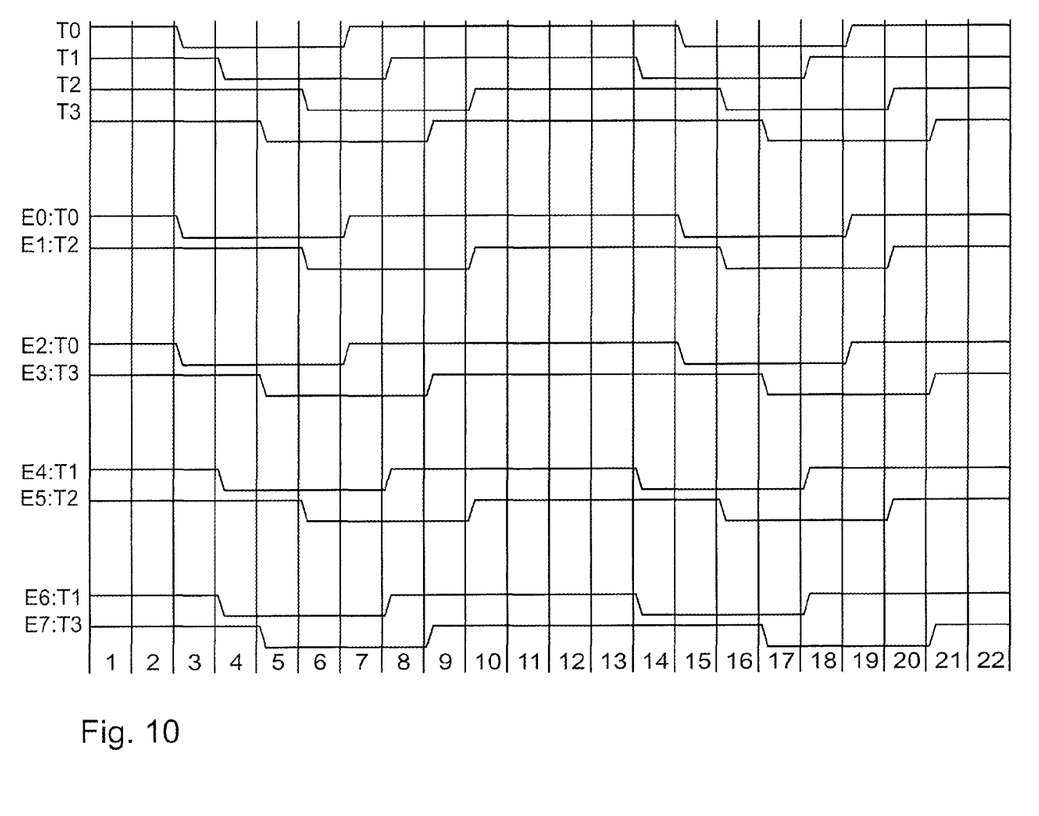
FIG. 10 shows a seventh signal course diagram for the safety system according to FIG. 3.

The signal course diagram according to FIG. 10 shows a possible signal course for the safety system 59 according to FIG. 3. As described above, the safety system 59 according to FIG. 3 does not feature any clock generator for the first or second output ports 15, 16, but at each interface 3, an individual combination of clock generators 19 to 22 is connected to the respective safety components 60, 61, 62 and 63. In the signal course diagram according to FIG. 10, the monitoring signals T0, T1, T2 and T3, which are applied to the respective output ports 15, 16, are shown. Also shown are the monitoring signals E0 to E7 which arrive at the evaluation circuits 25 to 32 and each of which is fed by the available monitoring signals T0 to T3, which is indicated by the notation E0:T0, E1:T2 etc. Like in the signal course diagrams according to FIGS. 4 to 9, work cycles in which the clock generators 19 to 22 only output monitoring signals at a logic "low" level are provided in the signal course diagram according to FIG. 10. In the illustrated embodiment, this is the case in work cycles 6 and 17. In the same way as in the signal course diagrams according to FIGS. 4 to 9, it can therefore be detected whether there is a short-circuit against a supply voltage.

Figure 11:
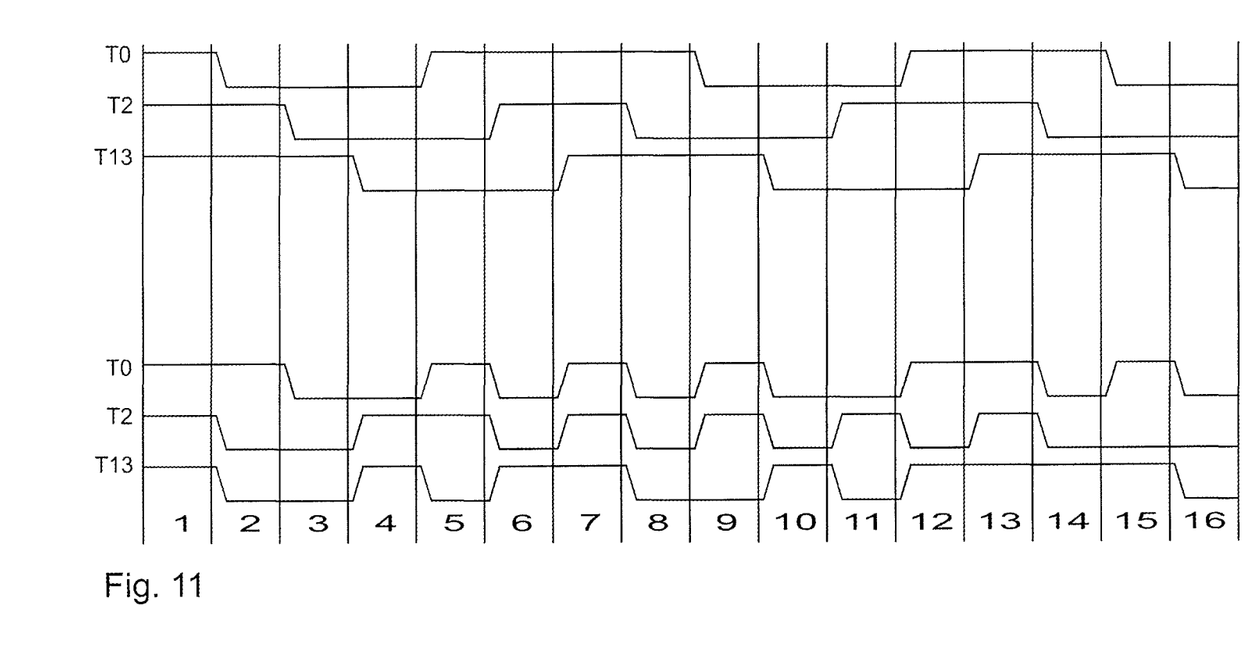
FIG. 11 shows an eighth signal course diagram for the safety system according to FIG. 3.

From the signal course diagram according to FIG. 11, it can be seen that the checking of the lines of a safety system 1, 49 or 59 is independent of regular or irregular signal courses, because the only thing that matters is that, within a preset period of time, all logic level combinations of monitoring signals are present.

The table below shows a combination of all signal states for a monitoring device not shown in the drawing, in which two output ports each are provided at two interfaces. In this, it is provided that a first clock generator T0 is connected to a first output port of the first interface, a second clock generator is connected to a first output port of a second interface and a third clock generator is connected to both output ports of both interfaces. Each clock generator can optionally output a monitoring signal at a "high" level, which is identified as "1" in the table, or at a "low" level, which is identified as "0" in the table. For a complete monitoring process, at least the signal combinations identified as "x" in the "Required" column have to be applied to the output ports.

| Required | T0 | T2 | T13 |
|---|---|---|---|
| x | 1 | 0 | 0 |
|   | 1 | 1 | 0 |

-continued

| Required | T0 | T2 | T13 |
|---|---|---|---|
| x | 0 | 1 | 0 |
| x | 0 | 1 | 1 |
|   | 1 | 1 | 1 |
|   | 1 | 0 | 1 |
|   | 0 | 0 | 1 |
| x | 0 | 0 | 0 |

The invention claimed is:

1. A monitoring device for monitoring safety components comprising monitoring electronics which include a plurality of clock generators and a plurality of evaluation means and on which at least two interfaces to be monitored for electric coupling to safety components are formed, wherein each of the interfaces comprises at least two output ports and at least two input ports, wherein each of a first output port and a second output port is connected to a clock generator designed for providing clocked electric monitoring signals, wherein each of a first input port and a second input port is connected to a respective evaluation means designed for an evaluation of incoming monitoring signals and for an output of a fault message when provided monitoring signals fail to appear, and wherein the number of clock generators is greater than two and less than the number of all output ports of the interfaces to be monitored, and
wherein the first output port of each interface is connected to an individually assigned clock generator, and wherein second output ports of at least two interfaces are connected to a common clock generator.

2. The monitoring device according to claim 1, wherein the common clock generator is connected to all second output ports of the interfaces to be monitored.

3. The monitoring device according to claim 1, wherein each interface has precisely two output ports and precisely two input ports, and wherein a first output port is connected to the individually assigned clock generator and a second output port is connected to the common clock generator, and wherein a first input port is connected to the evaluation means and a second input port is connected to the evaluation means.

4. A safety system comprising a monitoring device according to claim 1 and at least one safety component which comprises connecting means for connection to the interface of the monitoring device, the connecting means comprising at least four electric lines designed in pairs for the electric coupling of a functional element to be monitored.

5. A method for operating a safety system having a monitoring device comprising monitoring electronics which include a plurality of clock generators and a plurality of evaluation means and on which at least two interfaces to be monitored for electric coupling to safety components are formed, wherein each of the interfaces comprises at least two output ports and at least two input ports, wherein each of a first output port and a second output port is connected to a clock generator designed for providing clocked electric monitoring signals, wherein each of a first input port and a second input port is connected to a respective evaluation means designed for an evaluation of incoming monitoring signals and for an output of a fault message when provided monitoring signals fail to appear, and wherein the number of clock generators is greater than two and less than the number of all output ports of the interfaces to be monitored, and wherein the first output port of each interface is connected to an individually assigned clock generator, and wherein second output ports of at least two interfaces are connected to a common clock generator, the method comprising operating the clock generators in such a way that, in recurring periods of time, the monitoring signals made available to the interfaces by the clock generators have a signal level below a presettable response threshold of the evaluation means.

6. The method according to claim 5, wherein each first output port of the interfaces to be monitored is assigned a clock generator for the provision of at least one individual monitoring signal, and wherein at least one clock generator is connected to second output ports of at least two interfaces for making available a common monitoring signal to these second output ports, wherein at a presettable first point in time all individual monitoring signals and at least one common monitoring signal are made available at the interfaces.

7. The method according to claim 6, wherein the individual monitoring signals and/or the at least one common monitoring signal is/are made available to the respective interfaces in cyclic recurrence.

8. The method according to claim 6, wherein no individual monitoring signal is applied to the interfaces at a presettable second point in time.

9. The method according to claim 6, wherein no common monitoring signal is applied to the interfaces at a presettable third point in time.

10. The method according to claim 6, wherein the clock generators are operated in such a way that at least one interface receives no individual monitoring signal and no common monitoring signal at a presettable fourth point in time.

11. The method according to claim 6, wherein an individual monitoring signal is applied to a single interface only at a presettable point in time, and/or in that cycle times for the provision of the monitoring signals are chosen to differ from one another.

12. The method according to claim 6, wherein at least one clock generator is permanently activated and the monitoring signal made available thereby is used for the electric supply of the safety component.

13. The method according to claim 5, wherein the clock generators for the provision of the monitoring signals are activated and deactivated in a time-offset manner.

* * * * *